(12) United States Patent　Park

(10) Patent No.: US 7,463,518 B2
(45) Date of Patent: Dec. 9, 2008

(54) LAYOUT STRUCTURE FOR USE IN FLASH MEMORY DEVICE

(75) Inventor: Jung-Hoon Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 88 days.

(21) Appl. No.: 11/409,950

(22) Filed: Apr. 25, 2006

(65) Prior Publication Data

US 2007/0047285 A1　Mar. 1, 2007

(30) Foreign Application Priority Data

Aug. 23, 2005　(KR) ...................... 10-2005-0077480

(51) Int. Cl.
*G11C 16/04* (2006.01)

(52) U.S. Cl. ...................... 365/185.05; 365/53; 365/63; 365/206; 365/185.18

(58) Field of Classification Search ................ 365/53, 365/63, 206, 185.05, 185.18
See application file for complete search history.

(56) References Cited

U.S. PATENT DOCUMENTS

| 5,652,450 | A | * | 7/1997 | Hirano | ...................... 257/323 |
| 6,195,306 | B1 | * | 2/2001 | Horiguchi et al. | ........... 365/226 |
| 6,310,815 | B1 | * | 10/2001 | Yamagata et al. | ...... 365/230.03 |
| 6,804,154 | B2 | | 10/2004 | Kitagawa et al. | |
| 6,847,576 | B2 | | 1/2005 | Kang | |
| 7,078,762 | B2 | * | 7/2006 | Ishii et al. | .................... 257/316 |
| 2001/0040274 | A1 | * | 11/2001 | Hidaka | ...................... 257/659 |

FOREIGN PATENT DOCUMENTS

| JP | 05090525 A | 4/1993 |
| JP | 10189877 A | 7/1998 |
| JP | 2000195297 A | 7/2000 |
| JP | 2004-199778 | 7/2004 |
| KR | 100172333 B1 | 10/1998 |
| KR | 100240665 | 10/1999 |
| KR | 1020040003209 | 1/2004 |
| KR | 1020060080423 A | 7/2006 |

* cited by examiner

*Primary Examiner*—Hoai V Ho
(74) *Attorney, Agent, or Firm*—Volentine & Whitt, PLLC

(57) ABSTRACT

A flash memory device includes a core region, high-voltage pump regions disposed at one side of the core region, and a peripheral control region disposed at one side of the core region and between the high-voltage pump regions.

14 Claims, 6 Drawing Sheets

LAYOUT STRUCTURE FOR USE IN FLASH MEMORY DEVICE

BACKGROUND OF THE INVENTION

1. Field of the Invention

Embodiments of the invention relate to semiconductor memory devices. More particularly, embodiments of the invention relate to flash memory devices.

This application claims the benefit of Korean Patent Application No. 10-2005-77480 filed on Aug. 23, 2005, the subject matter of which is hereby incorporated by reference in its entirety.

2. Discussion of Related Art

FIGS. (FIGS.) 1 through 3 illustrate a layout structure for a conventional flash memory device.

The conventional flash memory device generally includes three regions; a core region, a peripheral control region, and a high-voltage pump region. The overall layout structure of the flash memory device depends largely on the nature of the core region since the area occupied by the core region is large relative to the peripheral control region and the high-voltage pump region (i.e., the non-core regions).

A memory cell array, a row decoder circuit, a column decoder circuit, and a sense amplifier circuit are disposed in the peripheral control region. Connection pads, input/output circuitry, control logic, a predecoder circuit, and other circuit may also be disposed in the peripheral control region. High-voltage pump circuits adapted to generate various voltages associated with program, erase, and read functions are disposed in the high-voltage pump region.

These three principle regions may be variously laid out on a semiconductor die. For example, the peripheral control and high-voltage pump regions may be sequentially disposed to one side of the core region as shown in FIG. 1. Alternatively, the peripheral control and high-voltage pump regions may be disposed on opposite sides of the core region as shown in FIG. 2. Alternatively, the peripheral control region may be disposed "vertically" above or below the core region while the high-voltage pump region is disposed "laterally" to either side of the core region as shown in FIG. 3. In this context, the terms "vertical" and "lateral" have relative meanings ascribed to an assumed orientation of the core region. As such, these terms are merely used to define relative positions for the various regions in relation to one another and the core region.

As illustrated in the examples shown in FIGS. 1 through 3, the layout structure of conventional flash memory devices depends entirely on the disposition of the rectangular core region. Thus, the peripheral control region also assumes a rectangular shape. However, several problems arise when a peripheral control region is disposed in a rectangular shape. Above all, signal transfer lines disposed in a rectangular shaped peripheral control region are necessarily extended because of the shape of the peripheral control region. As signal transfer lines are extended, signal delay occurs.

In practice, the layout structure of the peripheral control region should be dictated by the layout of its constituent signal transfer lines, not by the shape and layout disposition of other die regions. However, this has not been the case conventionally, and layout efficiency of the peripheral control region has suffered accordingly.

SUMMARY OF THE INVENTION

In one embodiment, the invention provides a flash memory device comprising; a core region, a peripheral control region vertically disposed to one side of the core region, and dual high-voltage pump regions, each laterally disposed to opposite sides of the peripheral control region.

DESCRIPTION OF EXEMPLARY EMBODIMENTS

Embodiments of the invention will now be described in some additional detail with reference to the accompanying drawings. The invention may, however, be embodied in many different forms and should not be constructed as being limited to only the embodiments set forth herein. Rather, these embodiments are provided as teaching examples. Like numerals refer to like elements throughout the specification.

Figure 1:
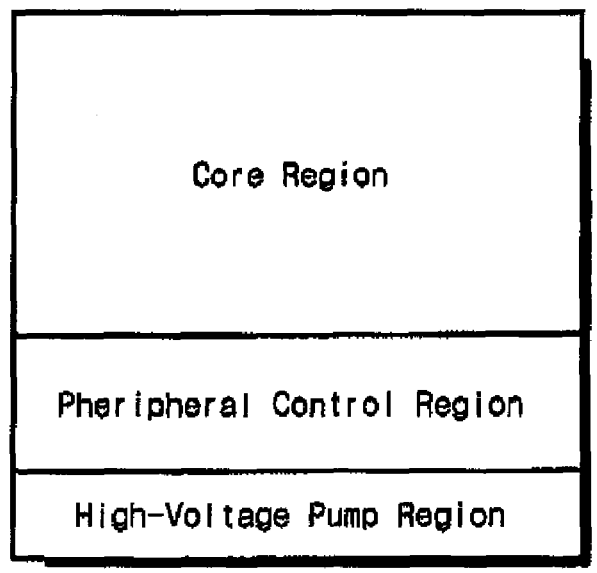
FIGS. 1 through 3 illustrate layout structures for conventional flash memory devices.
Figure 2:
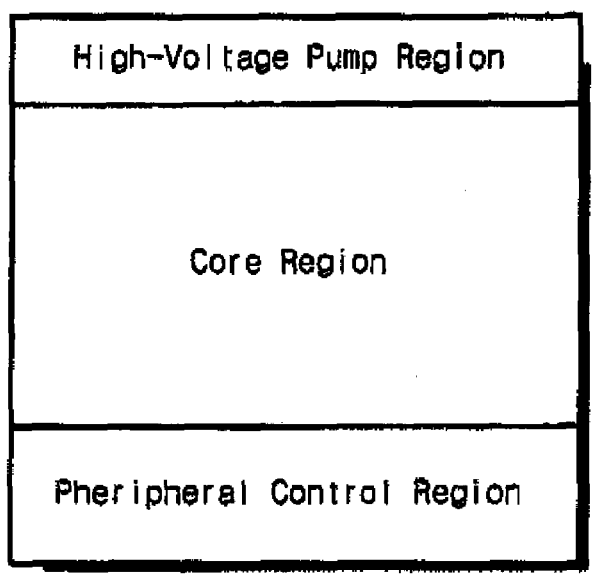
Figure 3:
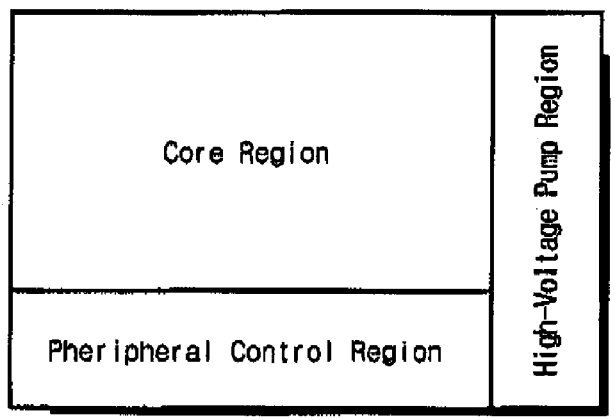
Figure 4:
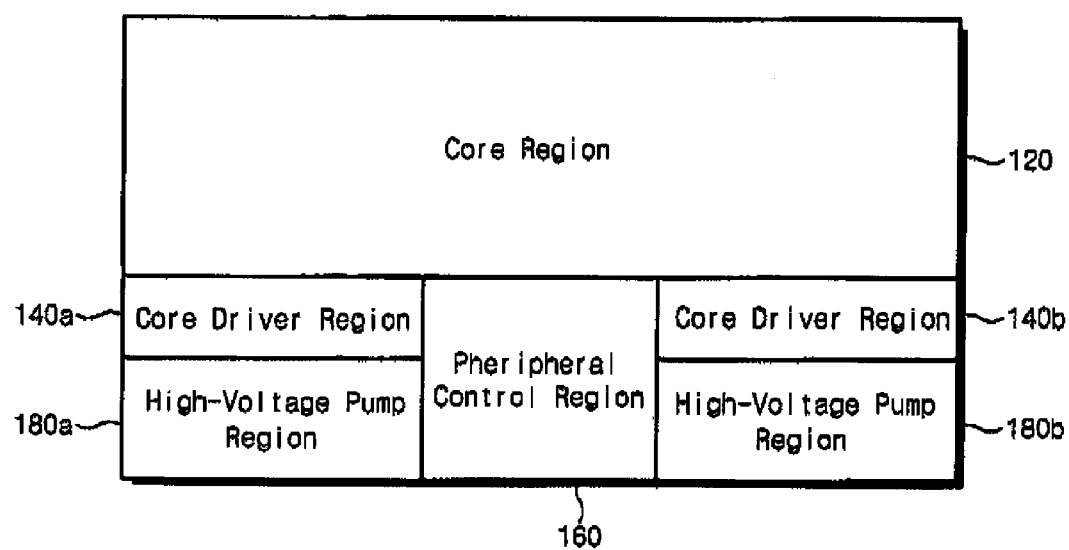
FIG. 4 is a block diagram of a layout structure for a flash memory device according to one embodiment of the invention.

FIG. 4 is a block diagram of a layout structure for a flash memory device 100 according to one embodiment of the invention. The exemplary flash memory device is assumed to be a NAND flash memory device for purposes of illustration. Nonetheless, it will be understood by persons of ordinary skill in the art that the invention is not limited to only NAND flash memory devices.

As illustrated in FIG. 4, flash memory device 100 includes a core region 120, core driver regions 140a and 140b, a peripheral control region 160, and dual high-voltage pump regions 180a and 180b. Core region 120 will typically include a memory cell array, row and column decoder circuits, and a page buffer circuit. Core driver regions 140a and 140b will typically include drivers adapted to generate driving signals to be transferred to row and column decoders, and a page buffer circuit. Peripheral control region 160 will typically include connection pads, an input/output circuit, a control logic, a predecoder circuit, an internal voltage generator circuit, a reference voltage generator circuit, and so forth. High-voltage pump regions 180a and 180b will typically include high-voltage pump circuits adapted to generate various voltages associated with, for example, program, read, erase operations.

As illustrated in FIG. 4, peripheral control region 160 is disposed between high-voltage pump regions 180a and 180b. Namely, the high-voltage pump regions 180a and 180b are disposed laterally on both sides of peripheral control region 160. Core driver region 140a is disposed between high-voltage pump region 180a and core region 120, and core driver region 140b is disposed between high-voltage pump region 180b and core region 120. Namely, core driver regions 140a and 140b are also disposed laterally on both sides of peripheral control region 160. This exemplary layout allows peripheral control region 160 to have a square shape, not a rectangular shape. If peripheral control region 160 has a square shape, the above-mentioned problems (e.g., signal delay and inefficient layout usage) may be remedied.

Figure 5:
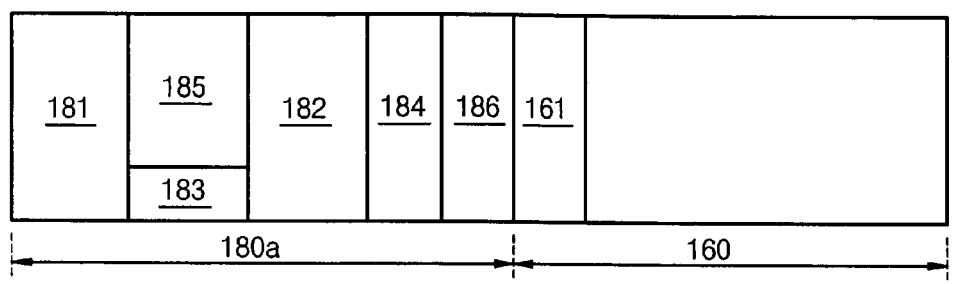
FIG. 5 is a block diagram of the high-voltage pump and peripheral control regions shown in FIG. 4.
Figure 6:
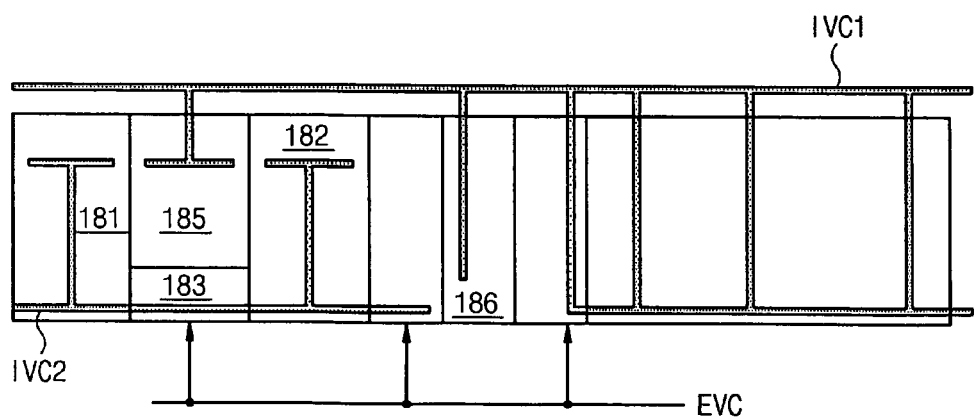
FIG. 6 illustrates one approach to an internal power supply system for the circuits shown in FIG. 5.

FIG. 5 is a block diagram further illustrating the high-voltage pump region 180a and peripheral control region 160 shown in FIG. 4. FIG. 6 further illustrates a supply system adapted to provide internal power supply voltages to these regions. Such internal power supply voltages may be generated by an internal power supply voltage generator, for example. Although only high-voltage pump region 180a is shown in FIG. 5 in relation to peripheral control region 160, high-voltage pump region 180b may be similarly configured. For clarity, the numerous metal signal lines transferring signals and/or voltages through these regions are not shown in FIG. 5.

Referring to FIG. 5, high-voltage pump region 180a comprises high-voltage pump circuits 181 and 182, (first and second) internal power supply voltage generator circuits 183 and 184, a redundancy circuit 185, and a high-voltage regulator circuit 186. Internal power supply voltage generator circuits 183 and 184 receive an external power supply voltage (e.g., voltage EVC shown in FIG. 6) and generate a corresponding internal power supply voltage (e.g., voltage IVC2 shown in FIG. 6). High-voltage pump circuits 181 and 182 generate high voltages associated with read/program/erase operations from internal power supply voltage generated by internal power supply voltage generator circuits 183 and 184. High-voltage regulator circuit 186 receives the high voltages generated by high-voltage pump circuits 181 and 182 and regulates these voltages to a desired level. Redundancy circuit 185 may be used to store repair information (e.g., address information for addressing defect memory cells). The various specific circuits implementing the functionality provided by high-voltage pump region 180a are well known in the art and will not be described in further detail.

As illustrated in FIG. 5, high-voltage regulator circuit 186 is disposed laterally adjacent to peripheral control region 160. Redundancy circuit 185 is disposed between high-voltage pump circuits 181 and 182 and may include laser fuses. As is well known in the art, metal signal lines should not be formed in an area containing laser fuses, because one or more laser fuses may become inadvertently cut during the metal signal line formation process. Hence, redundancy circuit 185 should be disposed in high-voltage pump region 180a in an area having a relatively fewer number of metal signal lines disposed therein.

Peripheral control region 160 comprises a (third) internal power supply voltage generator circuit 161 adapted to generate a first internal power supply voltage (IVC1) from an external power supply voltage (EVC). The first internal power supply voltage (IVC1) generated by internal power supply voltage generator circuit 161 may be used in peripheral control region 160 and also supplied to redundancy circuit 185 and high-voltage regulator circuit 186 in high-voltage pump region 180a.

As illustrated in FIG. 6, a second internal power supply voltage (IVC2) generated by internal power supply voltage generator circuits 183 and 184 in high-voltage pump region 181a may be supplied to high-voltage pump circuits 181 and 182. Meanwhile, the first internal power supply voltage (IVC1) generated by internal power supply voltage generator circuit 161 in a peripheral control region 160 may be supplied to peripheral control region 160, redundancy circuit 185, and high-voltage regulator circuit 186 in a high-voltage pump region 180a.

In the illustrated example, the second internal power supply voltage (IVC2) supplied to high-voltage pump circuits 181 and 182 is separated from the first internal power supply voltage applied to other circuits. This separation diminishes and/or aids in the control of noise generated by operation of high-voltage pump circuits 181 and 182 that might adversely affect operation of the other circuits otherwise.

Figure 7:
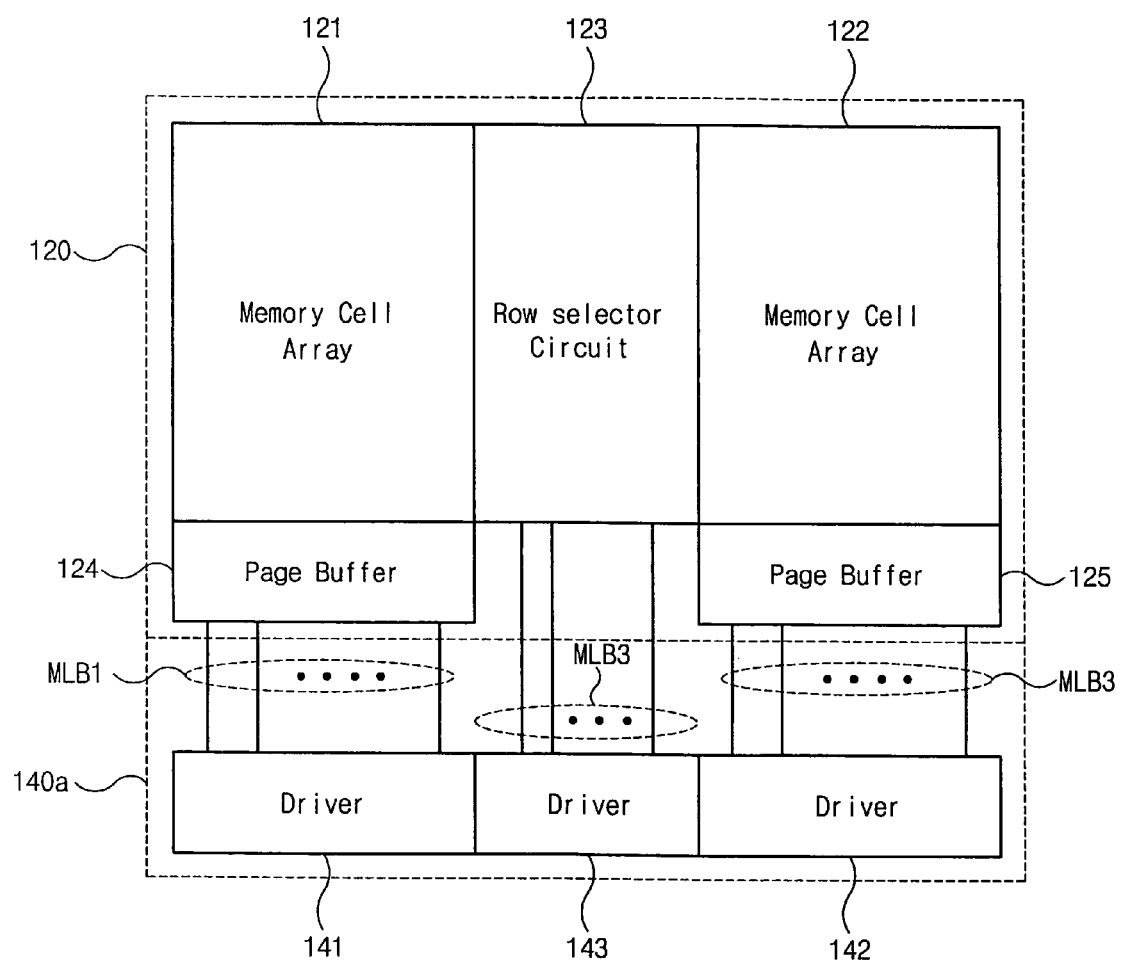
FIG. 7 is a partial block diagram of the core and core driver regions shown in FIG. 4.

FIG. 7 is a partial block diagram further illustrating the core and core driver regions of FIG. 4. Core region 120 comprises memory cell arrays 121 and 122, a row selector circuit 123, and page buffer circuits 124 and 125, which are all well known in the art and will not be described in further detail. Core driver region 140a comprises a plurality of drivers (e.g.,) 141, 142, and 143. Drivers 141 and 142 drive control signals that respectively control page buffer circuits 124 and 125, and driver 143 drives control signals (including e.g., decoding address signals) that control row selector circuit 123. Drivers 141 and 142 are disposed with the pitch of corresponding arrays 121 and 122. Likewise, the driver 143 may be disposed with the same line pitch as row selector circuit 123. Since these drivers are adjacently disposed with identical or similar pitches as the corresponding regions, the overall space occupied by metal signal lines (e.g.,) MLB1, MBL2, and MLB3 may be reduced over the conventional art and the constituent signal lines may be formed from a single metal layer during fabrication.

As is well known in the art, high-voltage pump circuits operate synchronously with a clock signal and generate a high voltage as the result of a voltage pumping operation. In response to a competent clock signal, such circuits may use commonly provided power supply and ground voltages to develop a high voltage in the order of (e.g.,) 20 volts. However, if the phase of the clock signal should change for some reason (e.g., an over-voltage condition), the high-voltage pumping operation may fail. For this reason, the signal line transferring the clock signal should be shielded by shield lines to prevent any adverse effects from surrounding high voltages.

Figure 8:
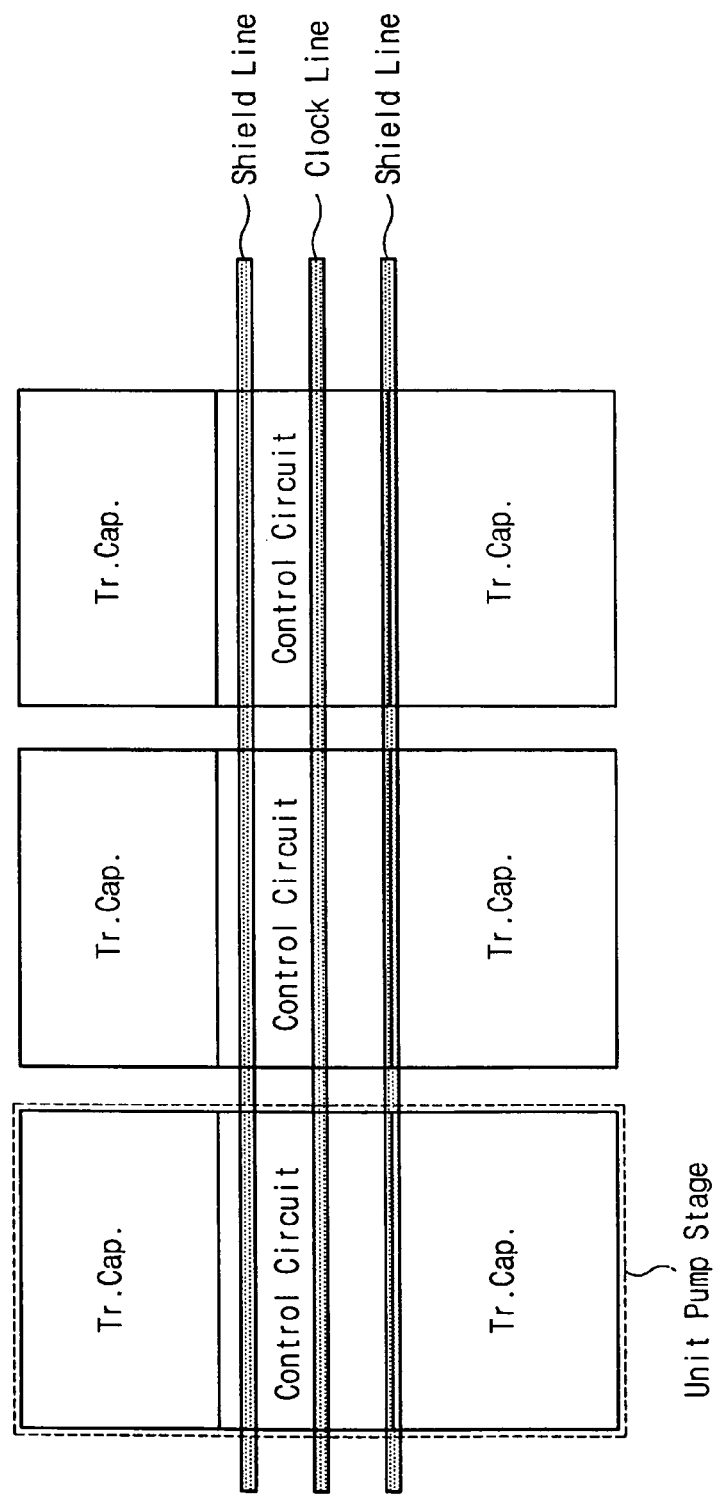
FIG. 8 illustrates a shield structure for a clock line disposed in a high-voltage pump region.
Figure 9:
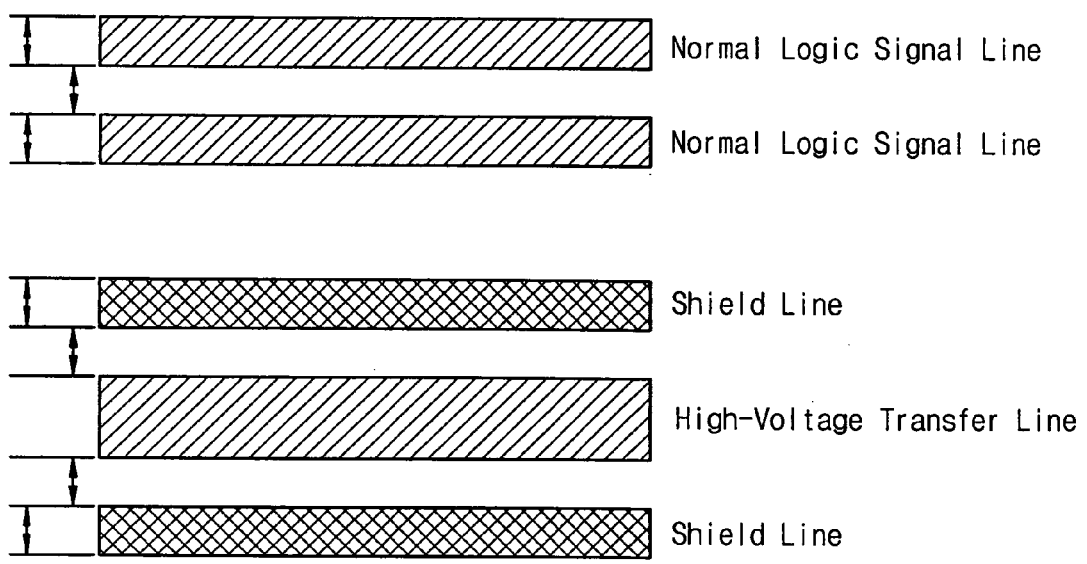
FIG. 9 illustrates a shield structure for a high-voltage transfer line disposed in a high-voltage pump region.

A common shielding layout is illustrated in FIG. 8. The shield lines in this example may be connected, for example, to the ground. Further, a high-voltage transfer line for transferring a high voltage may be configured to have width and spacing that are different from signal lines carrying other signals (e.g., logic signals). See, for example, FIG. 9. Similar to the shielded clock line, the high-voltage transfer line may also be shielded. Both clock line and high-voltage transfer line may be routinely disposed across high-voltage pump regions 180a and 180b of the foregoing embodiment.

While the present invention has been described in connection with several embodiments, it is not limited to only the foregoing. Rather, it will be apparent to those skilled in the art that various substitutions, modifications and changes may be to embodiments without departing from the scope of the invention as defined by the following claims.

What is claimed is:

1. A flash memory device comprising:
   a single unitary core region;
   a square-shaped peripheral control region disposed to one side of the single unitary core region; and,
   dual high-voltage pump regions, each disposed on opposite sides of the square-shaped peripheral control region.

2. The flash memory device of claim 1, wherein the square-shaped peripheral control region is vertically disposed in relation to the single unitary core region and the dual high-voltage pump regions are laterally disposed to the square-shaped peripheral control region, and
   the square-shaped peripheral control region utilizes a first internal power supply voltage, and at least one of the dual high-voltage pump regions utilizes a separate, second internal power supply voltage.

3. The flash memory device of claim 1, wherein:
each one of the dual high-voltage pump regions comprises a high-voltage regulator circuit disposed adjacent to the square-shaped peripheral control region.

4. A flash memory device comprising:
a core region;
a peripheral control region vertically disposed to one side of the core region; and
dual high-voltage pump regions, each laterally disposed to opposite sides of the peripheral control region, wherein each one of the dual high-voltage pump regions comprises:
a high-voltage regulator circuit disposed adjacent to the peripheral control region;
dual high-voltage pump circuits;
a redundancy circuit disposed between the dual high-voltage pump circuits;
a first internal power supply voltage generator circuit disposed between the dual high-voltage pump circuits; and
a second internal power supply voltage generator circuit disposed between the high-voltage regulator circuit and one of the high-voltage pump circuits.

5. The flash memory device of claim 4, wherein:
the peripheral control region comprises a third internal power supply voltage generator circuit.

6. The flash memory device of claim 5, wherein the first and second internal power supply voltage generator circuits are connected to at least one of the dual high-voltage pump circuits; and
the third internal power supply voltage generator circuit is connected to circuit within the peripheral control region, the redundancy circuit, and the high-voltage regulator circuit.

7. The flash memory device of claim 4, further comprising:
dual core driver regions disposed respectively between the dual high-voltage pump regions and the core region.

8. The flash memory device as recited in claim 7, wherein the core region comprises a memory cell array, a page buffer circuit, and a row decoder circuit; and
each one of the dual core driver regions comprises a first driver adapted to drive control signals to the page buffer circuit, and a second driver adapted to drive control signals to the row decoder circuit, wherein the first driver is disposed with a pitch similar to that of the memory cell array, and the second driver is disposed with a pitch similar to that of the row decoder circuit.

9. The flash memory device of claim 4, wherein the dual high-voltage pump regions each comprise a shielded clock line and at least one shielded high-voltage transfer line.

10. The flash memory device of claim 9, wherein the shielded high-voltage transfer line has width or spacing that differ from that associated with signal lines transferring logic signals.

11. The flash memory device of claim 9, wherein the shielded clock line is bracketed by dual shield lines connected to the ground.

12. The flash memory device of claim 10, wherein the shielded high-voltage transfer line is bracketed by dual shield lines connected to the ground.

13. The flash memory of claim 4, wherein each one of the dual high-voltage pump regions is vertically disposed to the one side of the core region.

14. A flash memory device comprising:
a core region comprising a memory cell array, a page buffer circuit, and a row decoder circuit;
a peripheral control region vertically disposed to one side of the core region;
dual high-voltage pump regions, each laterally disposed to opposite sides of the peripheral control region; and
dual core driver regions disposed respectively between the dual high-voltage pump regions and the core region, wherein each one of the dual core driver regions comprises a first driver adapted to drive control signals to the page buffer circuit, and a second driver adapted to drive control signals to the row decoder circuit, wherein the first driver is disposed with a pitch similar to that of the memory cell array, and the second driver is disposed with a pitch similar to that of the row decoder circuit.

* * * * *